(12) United States Patent
Zhang (10) Patent No.: US 11,665,936 B2
(45) Date of Patent: May 30, 2023

(54) OLED DISPLAY PANEL AND MANUFACTURING METHOD THEREOF (71) Applicant: Shenzhen China Star Optoelectronics Semiconductor Display Technology Co., Ltd., Shenzhen (CN)

(72) Inventor: Liangfen Zhang, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 625 days.

(21) Appl. No.: 16/623,843

(22) PCT Filed: Nov. 8, 2019

(86) PCT No.: PCT/CN2019/116561
§ 371 (c)(1),
(2) Date: Dec. 18, 2019

(87) PCT Pub. No.: WO2021/035964
PCT Pub. Date: Mar. 4, 2021

(65) Prior Publication Data
US 2021/0210571 A1 Jul. 8, 2021

(30) Foreign Application Priority Data
Aug. 26, 2019 (CN) .......................... 201910792284.5

(51) Int. Cl.
*H10K 59/126* (2023.01)
*H10K 50/824* (2023.01)
(Continued)

(52) U.S. Cl.
CPC ......... *H10K 59/126* (2023.02); *H10K 50/822* (2023.02); *H10K 50/824* (2023.02); *H10K 50/8423* (2023.02); *H10K 50/8426* (2023.02); *H10K 59/124* (2023.02); *H10K 71/00* (2023.02); *H10K 71/164* (2023.02);
(Continued)

(58) Field of Classification Search
CPC .............. H01L 2227/323; H01L 51/56; H01L 51/5228; H01L 51/5243; H01L 51/0021; H01L 51/5225; H01L 27/3258; H01L 27/3272
See application file for complete search history.

(56) References Cited

U.S. PATENT DOCUMENTS 9,373,668 B2* 6/2016 Kim .................... H01L 27/3246
10,026,790 B2* 7/2018 Kim .................... H01L 51/5228
(Continued)

FOREIGN PATENT DOCUMENTS

CN 103066212 4/2013
CN 104681588 6/2015
(Continued)

*Primary Examiner* — Errol V Fernandes
*Assistant Examiner* — Jeremy J Joy (57) ABSTRACT

The present invention provides an organic light-emitting diode (OLED) display panel including a substrate, a thin-film transistor, an insulating layer, an auxiliary electrode, an organic light-emitting layer, a shielding stage, and a common electrode. The common electrode is electrically connected to the auxiliary electrode. The shielding stage includes at least one organic material layer. An angle between the shielding stage and the substrate is a threshold value.

14 Claims, 6 Drawing Sheets

(51) Int. Cl.
*H10K 59/124* (2023.01)
*H10K 71/00* (2023.01)
*H10K 71/60* (2023.01)
*H10K 59/12* (2023.01)
*C23C 14/04* (2006.01)
*C23C 14/12* (2006.01)
*C23C 14/24* (2006.01)

(52) U.S. Cl.
CPC .......... *H10K 71/166* (2023.02); *H10K 71/60* (2023.02); *C23C 14/042* (2013.01); *C23C 14/12* (2013.01); *C23C 14/24* (2013.01); *H10K 59/1201* (2023.02); *H10K 59/123* (2023.02)

(56) References Cited

U.S. PATENT DOCUMENTS

| | | | | |
|---|---|---|---|---|
| 10,811,491 | B2* | 10/2020 | Fan | H01L 27/3246 |
| 11,476,322 | B2* | 10/2022 | Matsumi | H01L 51/5228 |
| 2009/0009069 | A1* | 1/2009 | Takata | H01L 27/3246 |
| | | | | 445/24 |
| 2009/0153046 | A1* | 6/2009 | Hayashi | H01L 51/5234 |
| | | | | 313/505 |
| 2012/0205678 | A1* | 8/2012 | Ikeda | H01L 51/5203 |
| | | | | 438/22 |
| 2013/0056784 | A1* | 3/2013 | Lee | H01L 27/3246 |
| | | | | 438/22 |
| 2013/0099218 | A1 | 4/2013 | Lee et al. | |
| 2015/0144902 | A1* | 5/2015 | Do | H01L 51/5228 |
| | | | | 257/40 |
| 2016/0013438 | A1* | 1/2016 | Im | H01L 51/5206 |
| | | | | 257/762 |
| 2016/0035813 | A1* | 2/2016 | Lee | H01L 51/5228 |
| | | | | 438/23 |
| 2016/0079325 | A1* | 3/2016 | Lee | H01L 27/3246 |
| | | | | 438/26 |
| 2016/0149155 | A1* | 5/2016 | Kim | H01L 27/3279 |
| | | | | 438/23 |
| 2016/0233285 | A1 | 8/2016 | Lee | |
| 2017/0062755 | A1* | 3/2017 | Im | H01L 51/5228 |
| 2017/0317154 | A1* | 11/2017 | Heo | H01L 27/3258 |
| 2018/0120620 | A1* | 5/2018 | Shim | H01L 27/3258 |
| 2018/0122876 | A1* | 5/2018 | Shim | H01L 51/5203 |
| 2018/0123078 | A1* | 5/2018 | Byun | H01L 51/5206 |
| 2018/0151831 | A1* | 5/2018 | Lee | H01L 27/3223 |
| 2018/0190934 | A1* | 7/2018 | Choi | H01L 27/3258 |
| 2019/0074335 | A1* | 3/2019 | Zhang | H01L 51/5234 |
| 2019/0165305 | A1* | 5/2019 | Zhang | H01L 27/3279 |
| 2019/0229152 | A1* | 7/2019 | Wang | H01L 27/32 |
| 2020/0135838 | A1* | 4/2020 | Han | H01L 27/3279 |
| 2020/0212162 | A1* | 7/2020 | Fan | H01L 27/3246 |

FOREIGN PATENT DOCUMENTS

| | | | | |
|---|---|---|---|---|
| CN | 105870151 | | 8/2016 | |
| CN | 105974689 | | 9/2016 | |
| CN | 109103215 | | 12/2018 | |
| CN | 109360900 A | * | 2/2019 | ......... H01L 51/5228 |
| CN | 110047893 A | * | 7/2019 | ......... H01L 27/3244 |
| CN | 110071225 A | * | 7/2019 | ......... H01L 27/3244 |
| CN | 110911461 | | 3/2020 | |
| JP | 2016-212979 | | 12/2016 | |
| KR | 20160141178 A | * | 12/2016 | ......... H01L 51/5203 |

* cited by examiner

OLED DISPLAY PANEL AND MANUFACTURING METHOD THEREOF

RELATED APPLICATIONS

This application is a National Phase of PCT Patent Application No. PCT/CN2019/116561 having International filing date of Nov. 8, 2019, which claims the benefit of priority of Chinese Patent Application No. 201910792284.5 filed on Aug. 26, 2019. The contents of the above applications are all incorporated by reference as if fully set forth herein in their entirety.

FIELD AND BACKGROUND OF THE INVENTION

The present invention is related to the field of display technology, and specifically to an organic light-emitting diode (OLED) display panel and a manufacturing method thereof.

Because organic light-emitting diode (OLED) display panels have advantages over display characteristics and quality of liquid crystal displays (LCDs), such as thinness and light weight, fast reaction times, low driving voltage, better display color, and wider viewing angles, they have received widespread attention from people. In recent years, development of OLED display panels changes with every passing day, and they can be produced into curved displays and developed into large sizes. However, large size OLED display panels have IR-drop problem due to their larger size. Especially in top-emitting panels, thin common electrode leads to a greater Rs and causes IR-drop problem and visible mura defect, which needs to be solved. In order to solve the problems, conventional processes form cathode isolating columns to divide a whole film of an original common electrode, and connects the common electrode to an auxiliary electrode below it. Alternatively, the common electrode can be connected to the auxiliary electrode by a method that uses laser to cut an organic light-emitting layer.

However, in a manufacturing process of OLED display panels, if an angle of vapor deposition of forming an organic light-emitting layer is not well controlled, the organic light-emitting layer may cover the auxiliary electrode, and the common electrode may not be connected to the auxiliary electrode, which causes the OLED display panel to display abnormally.

In summary, in the manufacturing process of the OLED display panel in the prior art, if an angle of vapor deposition of forming an organic light-emitting layer is not well controlled, the organic light-emitting layer may cover an auxiliary electrode, and a common electrode may not be connected to the auxiliary electrode, which causes the OLED display panel to display abnormally. Thus, it is necessary to improve this defect.

SUMMARY OF THE INVENTION

In a manufacturing process of an organic light-emitting diode (OLED) display panel in the prior art, if an angle of vapor deposition of forming an organic light-emitting layer is not well controlled, the organic light-emitting layer may cover an auxiliary electrode, and a common electrode may not be connected to the auxiliary electrode, which causes a technical problem of the OLED display panel to display abnormally.

In order to solve the problem above, the present invention provides the following technical solutions.

The present invention provides an organic light-emitting diode (OLED) display panel including a substrate, a thin-film transistor, an insulating layer, an auxiliary electrode, a pixel electrode, an organic light-emitting layer, a shielding stage, and a common electrode. The thin-film transistor is disposed on the substrate. The insulating layer is disposed on the thin-film transistor. The auxiliary electrode is disposed on the insulating layer. The pixel electrode is disposed on the insulating layer and electrically connected to the thin-film transistor. The organic light-emitting layer is disposed on the pixel electrode. The shielding stage is disposed on the insulating layer, and a projection of the shielding stage on the substrate partially overlaps a projection of the auxiliary electrode on the substrate. The common electrode is disposed on the organic light-emitting layer and electrically connected to the auxiliary electrode. The shielding stage includes at least one inorganic material layer, and an angle between the shielding stage and the substrate is a threshold value.

In the OLED display panel provided by an embodiment of the present invention, a cross-sectional shape of the shielding stage is an inverted trapezoid.

In the OLED display panel provided by an embodiment of the present invention, an area of an overlapping portion of the projection of the shielding stage on the substrate and the projection of the auxiliary electrode on the substrate accounts for over 50% of a total area of the projection of the auxiliary electrode on the substrate.

In the OLED display panel provided by an embodiment of the present invention, the threshold value ranges from 30 to 45 degrees.

In the OLED display panel provided by an embodiment of the present invention, the shielding stage includes at least one metal layer and at least one organic material layer disposed on the at least one metal layer.

In the OLED display panel provided by an embodiment of the present invention, the shielding stage includes at least two metal layers and at least two oxide layers.

In the OLED display panel provided by an embodiment of the present invention, the at least two metal layers are laminated, and the at least two oxide layers are laminated.

In the OLED display panel provided by an embodiment of the present invention, the common electrode surrounds at least two sides of the auxiliary electrode.

In the OLED display panel provided by an embodiment of the present invention, the OLED display panel further includes a pixel electrode layer, and the pixel electrode layer is patterned to form the pixel electrode and a shielding substrate of the shielding stage.

The present invention provides a manufacturing method of an organic light-emitting diode (OLED) display panel, including the steps of: providing a substrate and forming a circuit functional layer on the substrate; forming an auxiliary electrode on the circuit functional layer; forming a shielding stage on the circuit functional layer; and forming a common electrode on the circuit functional layer and controlling an evaporation angle to electrically connect the common electrode and the auxiliary electrode. A projection of the shielding stage on the substrate partially overlaps a projection of the auxiliary electrode on the substrate, the shielding stage includes at least one inorganic material layer, and an angle between the shielding stage and the substrate is a threshold value.

In the manufacturing method of the OLED display panel provided by an embodiment of the present invention, a cross-sectional shape of the shielding stage is an inverted trapezoid.

In the manufacturing method of the OLED display panel provided by an embodiment of the present invention, an area of an overlapping portion of the projection of the shielding stage on the substrate and the projection of the auxiliary electrode on the substrate accounts for over 50% of a total area of the projection of the auxiliary electrode on the substrate.

In the manufacturing method of the OLED display panel provided by an embodiment of the present invention, the threshold value ranges from 30 to 45 degrees.

In the manufacturing method of the OLED display panel provided by an embodiment of the present invention, the shielding stage includes at least one metal layer and at least one organic material layer disposed on the at least one metal layer.

In the manufacturing method of the OLED display panel provided by an embodiment of the present invention, the shielding stage includes at least two metal layers and at least two oxide layers.

An organic light-emitting diode (OLED) display panel provided by embodiments of the present invention forms a shielding stage on a substrate, and a projection of the shielding stage on the substrate partially overlaps a projection of an auxiliary electrode on the substrate. After this structure is formed, an organic light-emitting layer is vapor-deposited, and the organic light-emitting layer is unable to fully cover the auxiliary electrode under the shielding stage due to a protection of the shielding stage. An upper layer of the organic light-emitting layer is a common electrode. When the common electrode is vapor-deposited, an evaporation angle is controlled so that the common electrode can be electrically connected to the auxiliary electrode, which is under the shielding stage and unable to be covered by the organic light-emitting layer. In this way, an impedance of the common electrode can be reduced, and a problem of a large Rs can be improved, thereby a display effect of the display panel can be optimized.

BRIEF DESCRIPTION OF THE SEVERAL VIEWS OF THE DRAWINGS

In order to describe technical solutions in the present invention clearly, drawings to be used in the description of embodiments will be described briefly below. Obviously, drawings described below are only for some embodiments of the present invention, and other drawings may be obtained by those skilled in the art based on these drawings without creative efforts.

DESCRIPTION OF SPECIFIC EMBODIMENTS OF THE INVENTION

To further explain the technical means and effect of the present invention, the following refers to embodiments and drawings for detailed description. Obviously, the described embodiments are only for some embodiments of the present invention, instead of all embodiments. All other embodiments based on embodiments in the present invention and obtained by those skilled in the art without creative efforts are within the scope of the present invention.

In a manufacturing process of an organic light-emitting diode (OLED) display panel in the prior art, if an angle of vapor deposition of forming an organic light-emitting layer is not well controlled, the organic light-emitting layer may cover an auxiliary electrode, and a common electrode may not be connected to the auxiliary electrode, which causes a technical problem of the OLED display panel having abnormal display. Embodiments of the present invention can solve these defects.

Figure 1:
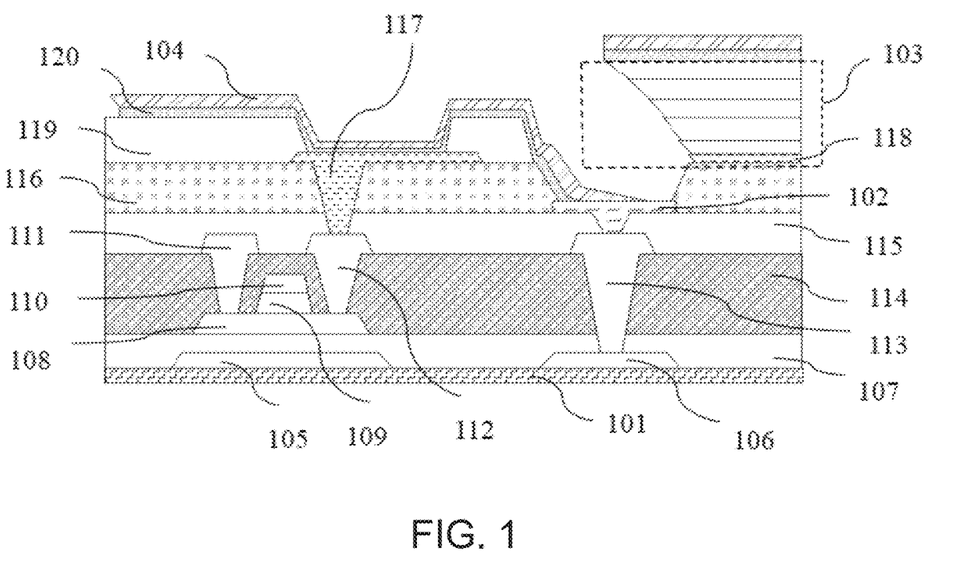
FIG. 1 is a structural diagram of an organic light-emitting diode (OLED) display panel provided by an embodiment of the present invention.

As shown in FIG. 1, which is a structural diagram of an organic light-emitting diode (OLED) display panel provided by an embodiment of the present invention, components of the present invention and relative positional relationships between the components can be seen clearly. The OLED display panel includes a substrate 101, an auxiliary electrode 102 disposed on the substrate 101, a shielding stage 103 disposed on the substrate 101, and a common electrode 104 disposed on the substrate 101 and electrically connected to the auxiliary electrode 102. A projection of the shielding stage 103 on the substrate 101 partially overlaps a projection of the auxiliary electrode 102 on the substrate 101. The shielding stage 103 includes at least one inorganic material layer, and an angle between the shielding stage 103 and the substrate 101 is a threshold value.

In an embodiment, the substrate can be made of a transparent plastic or an insulating polymer film. A light-shielding metal layer 105, a light-shielding metal layer 106, and a buffer layer 107 are disposed on the substrate 101. The buffer layer 107 covers the light-shielding metal layer 105 and light-shielding metal layer 106. The buffer layer 107 can protect a thin-film transistor (TFT) formed in the subsequent process from being contaminated by impurities such as alkali ions leaking from the substrate.

In an embodiment, a semiconductor layer 108 is disposed on the buffer layer 107. The semiconductor layer 108 can be formed of an amorphous silicon film, a polysilicon film formed by crystallizing amorphous silicon, an oxide semiconductor, or an organic semiconductor. A gate insulating layer 109 is disposed on the semiconductor layer 108. The gate insulating layer 109 can be formed of a silicon nitride film or a silicon dioxide film. A gate 110 and a scan line (not shown) are disposed on the gate insulating layer 109. An interlayer insulating layer 114 is disposed on the gate 110, the scan line, the semiconductor layer 108, and the buffer layer 107. The interlayer insulating layer 114 can be formed of a silicon nitride film or a silicon dioxide film. A source 111, a drain 112, and a data line (not shown) are disposed on the interlayer insulating layer 114. The source 111 is electrically connected to the corresponding data line. The source 111 and the drain 112 are electrically connected to both ends of the semiconductor layer 108 through holes. In this embodiment, the gate 110, the source 111, and the drain 112 form three ends of the TFT.

In an embodiment, a transfer electrode 113 is further disposed on the interlayer insulating layer 114. The transfer electrode 113 is electrically connected to the light-shielding metal layer 106 through a hole.

In an embodiment, an insulating layer 115 is disposed on the substrate 101. Specifically, in this embodiment, the insulating layer 115 is disposed on the interlayer insulating layer 114, the data line, the source 111, the drain 112, and the transfer electrode 113.

In an embodiment, a planarization layer 116 is disposed on the insulating layer 115. Two holes are defined on the planarization layer 116, one for filling the auxiliary electrode 102, the other for connecting a pixel electrode 117 and a driving circuit. The auxiliary electrode 102 is electrically connected to the transfer electrode 113. The pixel electrode 117 is electrically connected to the drain 112. A voltage signal transmitted to the pixel electrode 117 is controlled by the conduction of source 111 and the drain 112 of the TFT.

In an embodiment, the auxiliary electrode 102 can be indium tin oxide or any metal such as molybdenum, aluminum, titanium, or copper. A thickness of the auxiliary electrode 102 is not limited herein.

In an embodiment, a pixel defining layer 119 is formed on the pixel electrode 117 and the planarization layer 116. The pixel defining layer 119 defines a plurality of pixel regions. Specifically, the pixel defining layer 119 includes a plurality of lateral pixel defining portions extending in the X-axis direction, and a plurality of longitudinal pixel defining portions extending in the Y-axis direction. The plurality of lateral pixel defining portions and the plurality of longitudinal pixel defining portions intersect to form the plurality of pixel regions.

In an embodiment, a pixel electrode layer of the OLED display panel is patterned to form the pixel electrode 117 and a shielding substrate 118 of the shielding stage 103. A cross-sectional shape of the shielding stage 103 is an inverted trapezoid. An area of an overlapping portion of the projection of the shielding stage 103 on the substrate 101 and the projection of the auxiliary electrode 102 on the substrate 101 accounts for over 50% of a total area of the projection of the auxiliary electrode 102 on the substrate 101. The threshold value of the angle between the shielding stage 103 and the substrate 101 ranges from 30 to 45 degrees, and specifically, the larger a shielding area of the inverted trapezoid related to the angle is, the better.

In an embodiment, an organic light-emitting layer 120 is disposed on the pixel defining layer 119, the pixel electrode 117, the auxiliary electrode 102, and the shielding stage 103. When the organic light-emitting layer 120 is formed, the organic light-emitting layer 120 and the auxiliary electrode 102 are in contact with a very small area or not in contact by controlling an evaporation angle or vertical evaporation so that the organic light-emitting layer 120 is unable to be formed directly below the shielding stage 103.

In an embodiment, the common electrode 104 is formed on the organic light-emitting layer 120. The common electrode 104 is thin because it needs a high transmittance, but it leads to a large impedance. During processing, the common electrode 104 is formed under the shielding stage 103 and connected to the auxiliary electrode 102 by controlling the evaporation angle, which can decrease the impedance of the common electrode 104.

In an embodiment, structures and materials of the shielding stage 103 can be at least one metal layer and at least one organic material layer disposed on the at least one metal layer, or at least two metal layers and at least two oxide layers. The at least two metal layers are disposed in a stack, and the at least two oxide layers are disposed in a stack. A specific structure is to increase a chamfering angle of the inverted trapezoid. The larger the chamfering angle, the larger the shielding area, and the larger a contact area between the common electrode 104 and the auxiliary electrode 102 becomes, and a situation that the common electrode 104 cannot be in contact with the auxiliary electrode 102 will not happen.

Figure 2A:
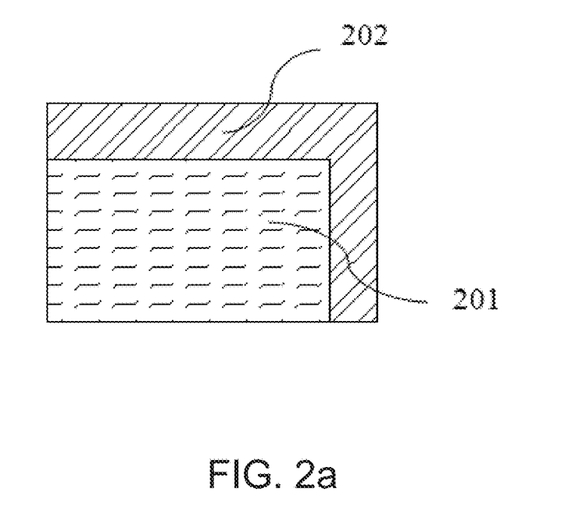
FIGS. 2a and 2b are structural diagrams of a connection between a common electrode and an auxiliary electrode provided by an embodiment of the present invention.
Figure 2B:
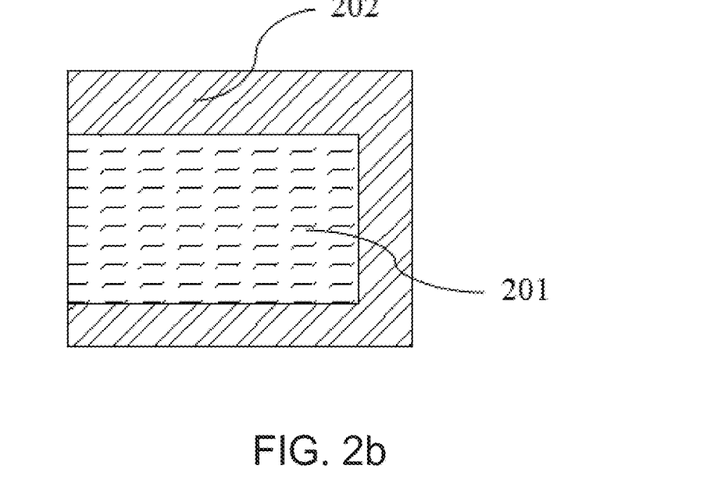

As shown in FIGS. 2a and 2b, which are structural diagrams of a connection between the common electrode 202 and the auxiliary electrode 201 provided by an embodiment of the present invention, the common electrode 202 surrounds at least two sides of the auxiliary electrode 201.

In an embodiment, as shown in FIG. 2a, the common electrode 202 surrounds two sides of the auxiliary electrode 201. Specifically, the two sides can be two connected sides (i.e. L-shaped contacts) or two opposite sides. As shown in FIG. 2b, the common electrode 202 surrounds three sides of the auxiliary electrode 201 (i.e. U-shaped contacts).

Figure 3:
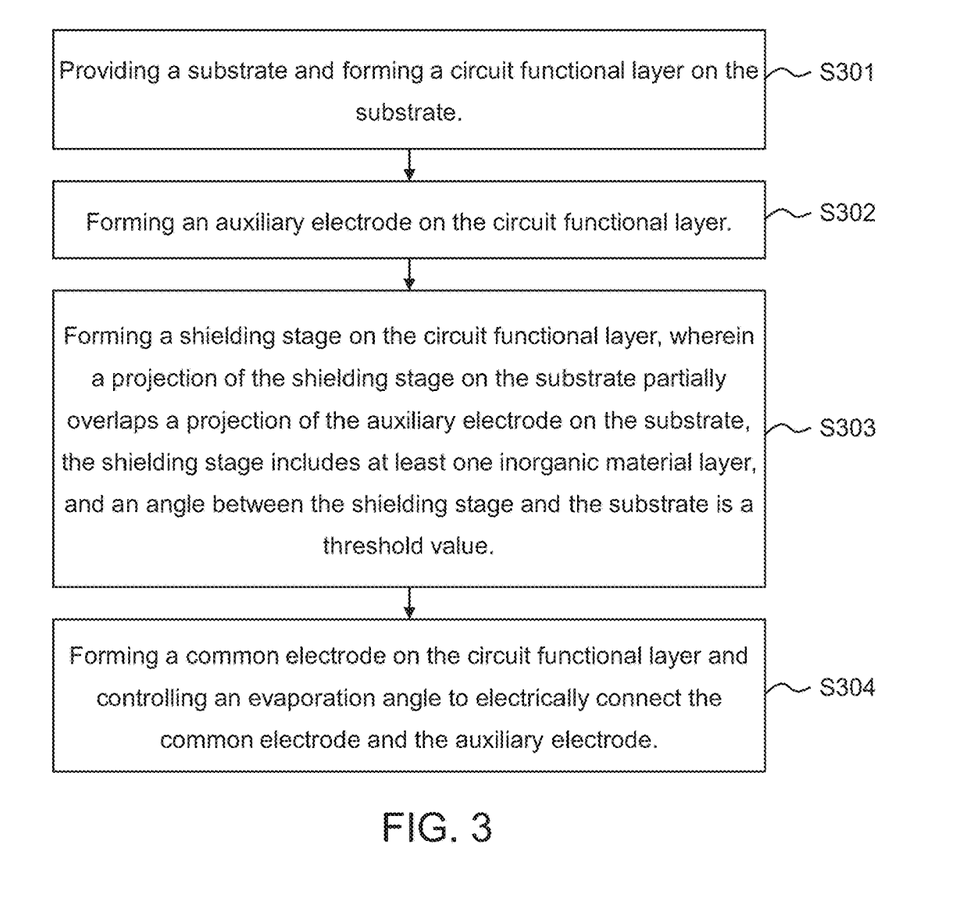
FIG. 3 is a flowchart of a manufacturing method of the OLED display panel provided by an embodiment of the present invention.
Figure 4A:
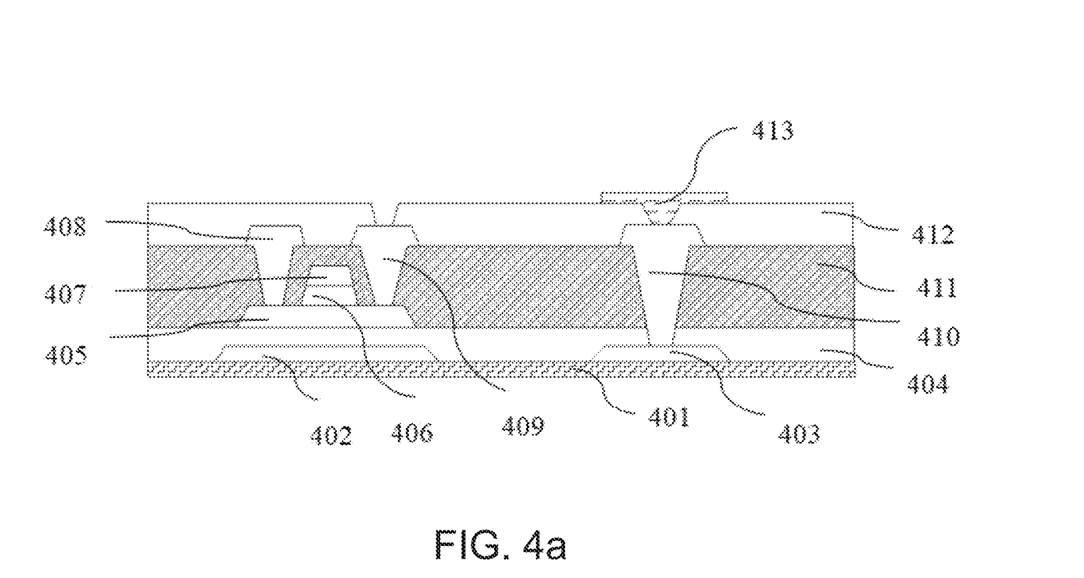
FIGS. 4a to 4g are structural diagrams of manufacturing processes of the OLED display panel provided by an embodiment of the present invention.
Figure 4B:
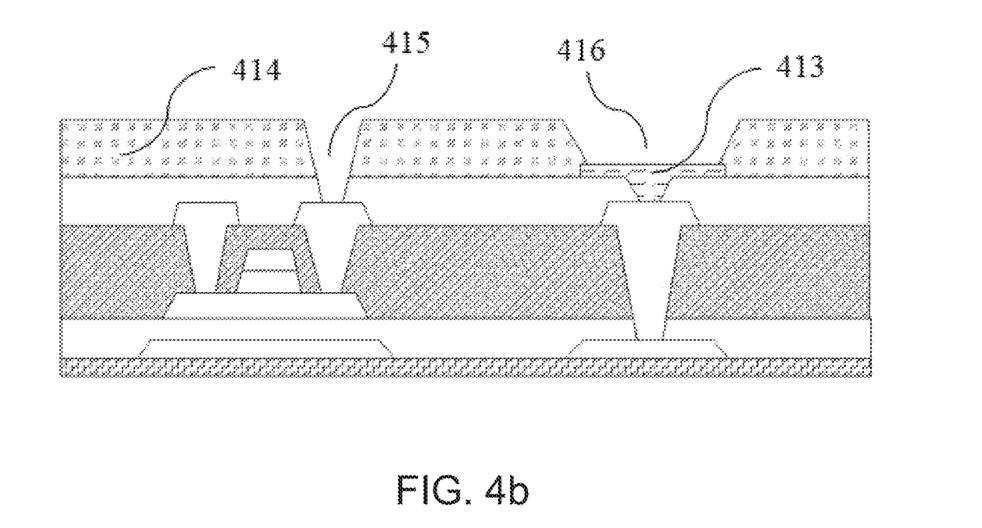
Figure 4C:
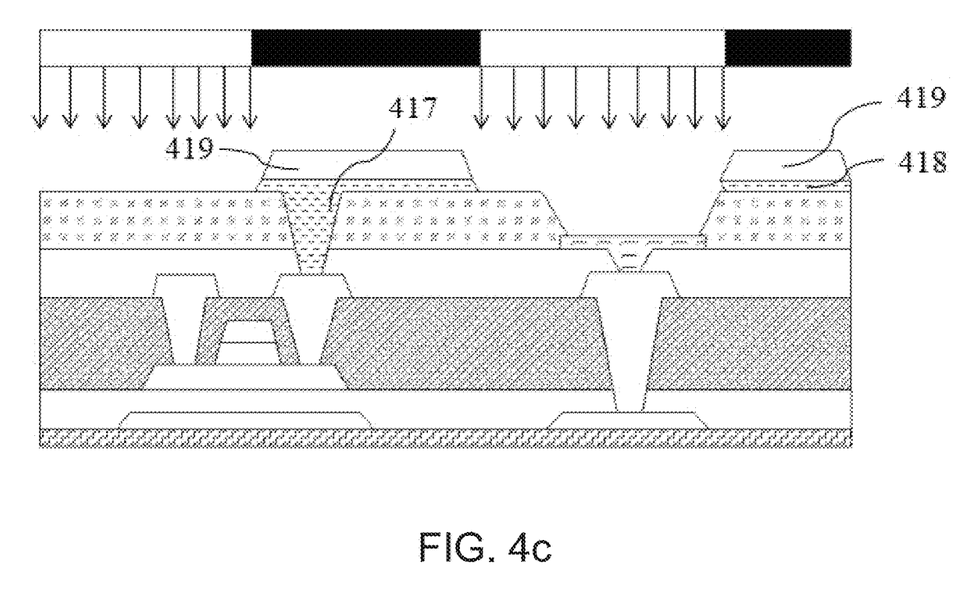
Figure 4D:
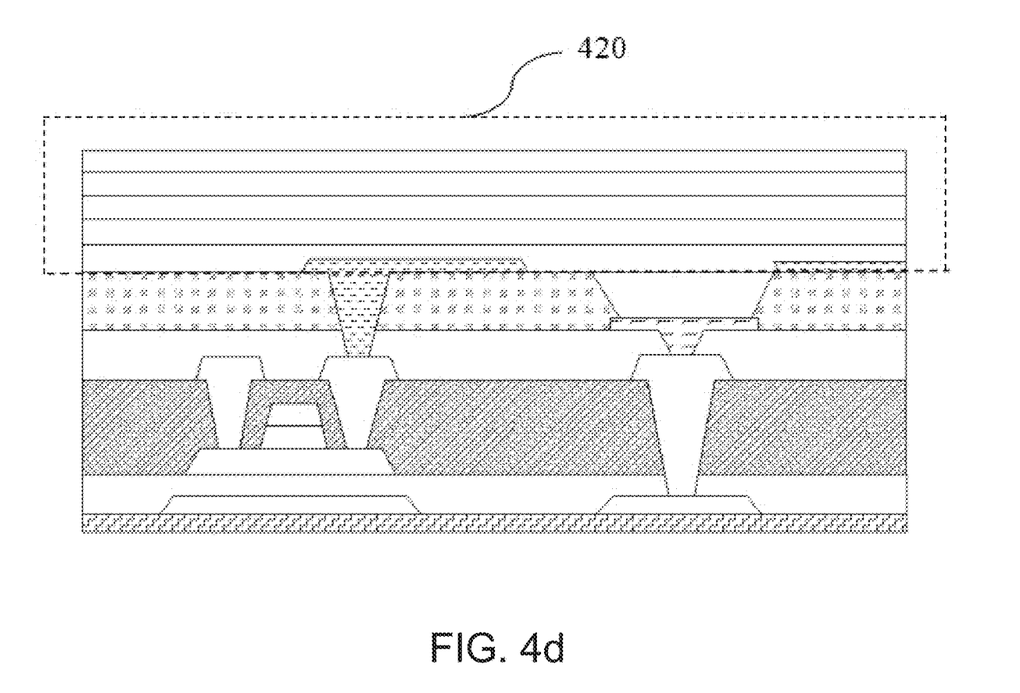
Figure 4E:
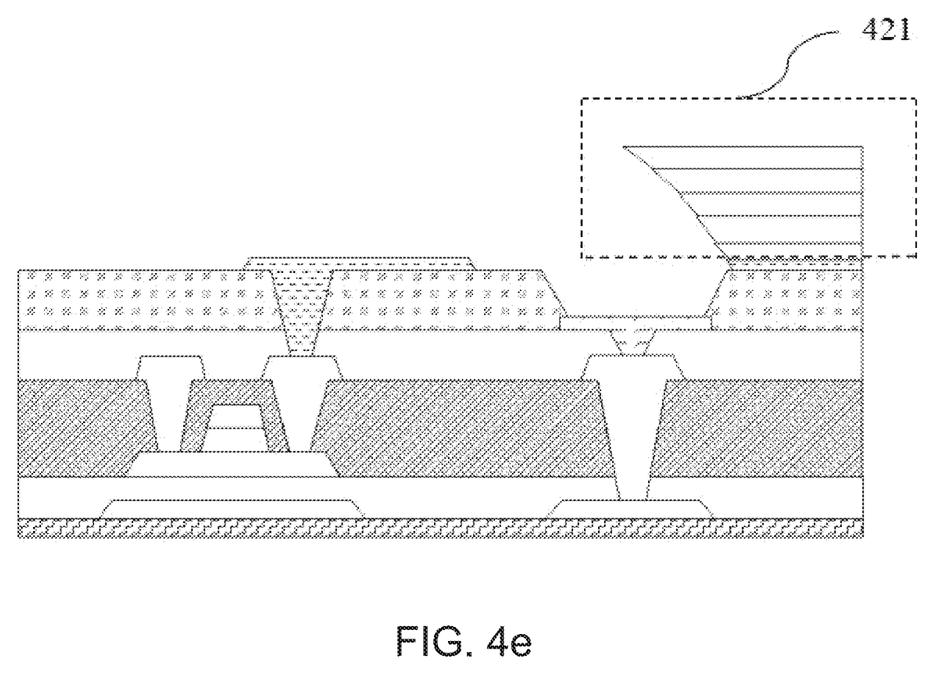
Figure 4F:
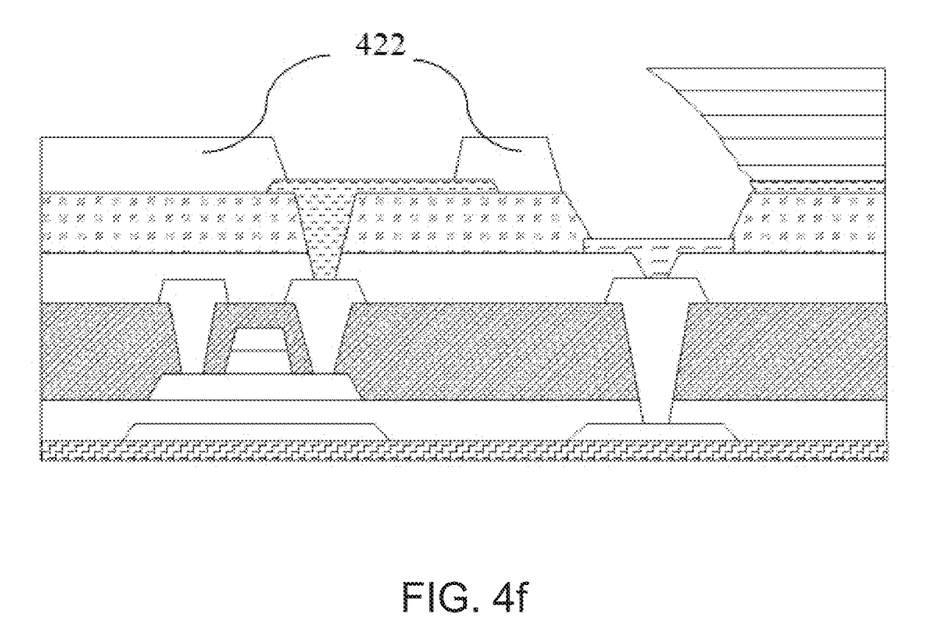
Figure 4G:
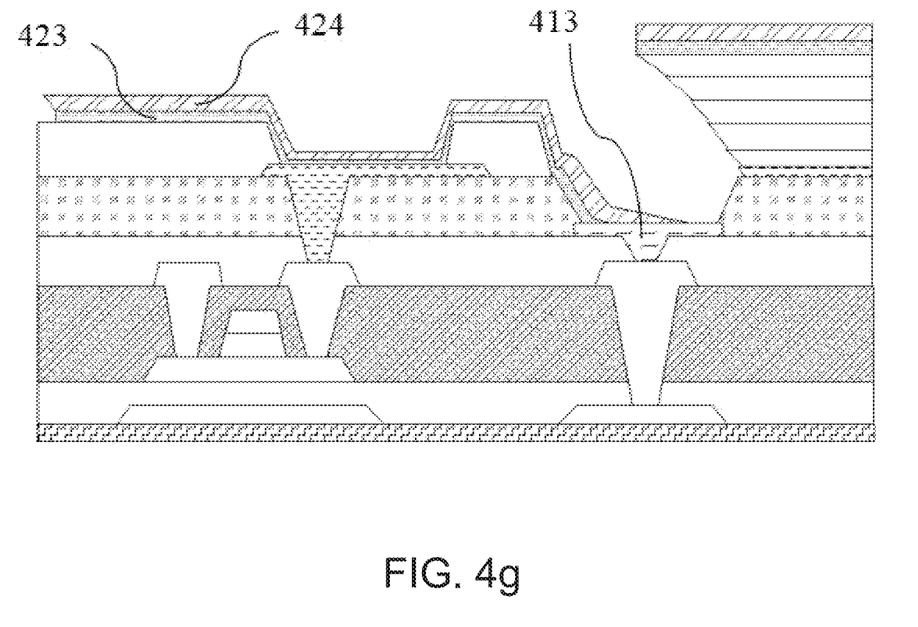

As shown in FIG. 3, which is a flowchart of a manufacturing method of the OLED display panel provided by an embodiment of the present invention, the manufacturing method includes the steps of:

S301, providing a substrate and forming a circuit functional layer on the substrate;

S302, forming an auxiliary electrode on the circuit functional layer;

S303, forming a shielding stage on the circuit functional layer, wherein a projection of the shielding stage on the substrate partially overlaps a projection of the auxiliary electrode on the substrate, the shielding stage comprises at least one inorganic material layer, and an angle between the shielding stage and the substrate is a threshold value; and S304, forming a common electrode on the circuit functional layer and controlling an evaporation angle to electrically connect the common electrode and the auxiliary electrode.

In an embodiment, in S302, a pixel electrode layer of the OLED display panel is patterned to form a pixel electrode and a shielding substrate. A cross-sectional shape of the shielding stage is an inverted trapezoid. An area of an overlapping portion of the projection of the shielding stage on the substrate and the projection of the auxiliary electrode on the substrate accounts for over 50% of a total area of the projection of the auxiliary electrode on the substrate. The threshold value of the angle between the shielding stage and the substrate ranges from 30 to 45 degrees, and specifically, the larger a shielding area of the inverted trapezoid related to the angle is, the better.

In an embodiment, an organic light-emitting layer is disposed on a pixel defining layer, the pixel electrode, the auxiliary electrode, and the shielding stage. When the organic light-emitting layer is formed, the organic light-emitting layer and the auxiliary electrode are in contact with a very small area or not in contact by controlling an evaporation angle or vertical evaporation so that the organic light-emitting layer is unable to be formed directly below the shielding stage.

In an embodiment, the common electrode is formed on the organic light-emitting layer. The common electrode is thin because it needs a high transmittance, but it leads to a large impedance. During processing, the common electrode is formed under the shielding stage and connected to the auxiliary electrode by controlling the evaporation angle, which can decrease the impedance of the common electrode.

In an embodiment, structures and materials of the shielding stage 103 can be at least one metal layer and at least one organic material layer disposed on the at least one metal layer, or at least two metal layers and at least two oxide layers. The at least two metal layers are disposed in a stack, and the at least two oxide layers are disposed in a stack. A specific structure is to increase a chamfering angle of the inverted trapezoid. The larger the chamfering angle, the larger the shielding area, and the larger a contact area between the common electrode and the auxiliary electrode becomes, and a situation that the common electrode cannot be in contact with the auxiliary electrode will not happen.

In an embodiment, the common electrode surrounds two sides of the auxiliary electrode. Specifically, the two sides can be two connected sides (i.e. L-shaped contacts) or two opposite sides. The common electrode surrounds three sides of the auxiliary electrode (i.e. U-shaped contacts).

As shown in FIGS. 4a to 4g, which are structural diagrams of manufacturing processes of the OLED display panel provided by an embodiment of the present invention, a substrate 401 is provided, the substrate 401 can be made of a transparent plastic or an insulating polymer film. First, a light-shielding metal layer 402, a light-shielding metal layer 403, and a buffer layer 404 are disposed on the substrate 401. The buffer layer 404 covers the light-shielding metal layer 402 and light-shielding metal layer 403. The buffer layer 404 can protect a thin-film transistor (TFT) formed in the subsequent process from being contaminated by impurities such as alkali ions leaking from the substrate. Then, a semiconductor layer 405 is disposed on the buffer layer 404. The semiconductor layer 405 can be formed of an amorphous silicon film, a polysilicon film formed by crystallizing amorphous silicon, an oxide semiconductor, or an organic semiconductor. A gate insulating layer 406 is disposed on the semiconductor layer 405. The gate insulating layer 406 can be formed of a silicon nitride film or a silicon dioxide film. A gate 407 and a scan line (not shown) are disposed on the gate insulating layer 406. An interlayer insulating layer 411 is disposed on the gate 407, the scan line, the semiconductor layer 405, and the buffer layer 404. The interlayer insulating layer 411 can be formed of a silicon nitride film or a silicon dioxide film. A source 408, a drain 409, and a data line (not shown) are disposed on the interlayer insulating layer 411. The source 408 is electrically connected to the corresponding data line. The source 408 and the drain 409 are electrically connected to both ends of the semiconductor layer 405 through holes. In this embodiment, the gate 407, the source 408, and the drain 409 form three ends of the TFT. A transfer electrode 410 is further disposed on the interlayer insulating layer 411. The transfer electrode 410 is electrically connected to the light-shielding metal layer 403 through a hole. An insulating layer 412 is disposed on the substrate 401. Specifically, in this embodiment, the insulating layer 412 is disposed on the interlayer insulating layer 411, the data line, the source 408, the drain 409, and the transfer electrode 410. Then, an auxiliary electrode 413 is formed on the insulating layer 412. The auxiliary electrode 413 can be indium tin oxide or any metal such as molybdenum, aluminum, titanium, or copper. A thickness of the auxiliary electrode 413 is not limited herein.

Next, a planarization layer 414 is disposed on the insulating layer 412 and can be a film deposited by chemical vapor deposition or a flexible material, or a combination of the two. Two holes are defined on the planarization layer 412, one for exposing the auxiliary electrode 413, the other for connecting a pixel electrode and a driving circuit. The auxiliary electrode 413 is electrically connected to the transfer electrode 410.

Then, a pixel electrode layer is formed. A material of the pixel electrode layer is indium tin oxide/silver/indium tin oxide. A photoresist 419 is coated on the pixel electrode layer. The pixel electrode layer is patterned to form a pixel electrode 417 and a shielding substrate 418. A film thickness of the shielding substrate 418 can be same as or different from the pixel electrode 417. The pixel electrode 417 is electrically connected to the drain 409. A voltage signal transmitted to the pixel electrode 417 is controlled by the conduction of source 408 and the drain 409 of the TFT.

Next, at least one inorganic material layer 420 is coated on the OLED display panel to form a shielding stage 421. A cross-sectional shape of the shielding stage 421 is an inverted trapezoid. An area of an overlapping portion of a projection of the shielding stage 421 on the substrate 401 and a projection of the auxiliary electrode 413 on the substrate 401 accounts for over 50% of a total area of the projection of the auxiliary electrode 413 on the substrate 401. A threshold value of the angle between the shielding stage 421 and the substrate 401 ranges from 30 to 45 degrees, and specifically, the larger a shielding area of the inverted trapezoid related to the angle is, the better. A pixel defining layer 422 is formed on the pixel electrode 417 and the planarization layer 414. The pixel defining layer 422 can be a negative photoresist or a bank. The pixel defining layer 422 defines a plurality of pixel regions. Specifically, the pixel defining layer 422 includes a plurality of lateral pixel defining portions extending in the X-axis direction, and a plurality of longitudinal pixel defining portions extending in the Y-axis direction. The plurality of lateral pixel defining portions and the plurality of longitudinal pixel defining portions intersect to form the plurality of pixel regions.

Lastly, an organic light-emitting layer 423 is disposed on a pixel defining layer 422, the pixel electrode 417, the auxiliary electrode 413, and the shielding stage 421. When the organic light-emitting layer 423 is formed, the organic light-emitting layer 423 and the auxiliary electrode 413 are in contact with a very small area or not in contact by controlling an evaporation angle or vertical evaporation so that the organic light-emitting layer 423 is unable to be formed directly below the shielding stage 421. The common electrode 424 is formed on the organic light-emitting layer 423. The common electrode 424 is thin because it needs a high transmittance, but it leads to a large impedance. During processing, the common electrode 424 is formed under the shielding stage 421 and connected to the auxiliary electrode 413 by controlling the evaporation angle, which can decrease the impedance of the common electrode 424.

In an embodiment, the shielding stage 421 includes two stacked metal layers disposed and three stacked non-metal layers disposed on the two metal layers. The upper three non-metal layers are gradually densified from bottom to top, and have a certain selectivity ratio of a dry etching. The bottom two metal layers also have a certain selectivity ratio of a wet etching, and an etching speed from bottom to top is gradually slowed down. Because the upper three non-metal layers have the certain selectivity ratio of the dry etching and the bottom two metal layers have the certain selectivity ratio of the wet etching, the inverted trapezoid is formed finally.

In an embodiment, the metal layers can be two or more layers, and can be a combination of metals such as molybdenum, aluminum, or copper or a combination of alloys. The two or more layers of metal layers have a certain selectivity ratio of an etching solution, and an etching speed from bottom to top is gradually slowed down, therefore the inverted trapezoid is formed. The non-metal layers can be two or more layers, and can be silicon oxide, silicon nitride, or silicon oxynitride. The two or more layers of non-metal layers have a certain selectivity ratio of dry etching, and an etching speed from bottom to top is gradually slowed down, therefore the inverted trapezoid is formed.

The OLED display panel and the manufacturing method thereof provided by embodiments of the present invention can be applied to an OLED evaporation or an inkjet printing (IJP) technology.

In summary, an organic light-emitting diode (OLED) display panel provided by embodiments of the present invention forms a shielding stage on a substrate, and a projection of the shielding stage on the substrate partially overlaps a projection of an auxiliary electrode on the substrate. After this structure is formed, an organic light-emitting layer is vapor-deposited, and the organic light-emitting layer is unable to fully cover the auxiliary electrode under the shielding stage due to a protection of the shielding stage. An upper layer of the organic light-emitting layer is a common electrode. When the common electrode is vapor-deposited, an evaporation angle is controlled so that the common electrode can be electrically connected to the auxiliary electrode, which is under the shielding stage and unable to be covered by the organic light-emitting layer. In this way, an impedance of the common electrode can be reduced, and a problem of a large Rs can be improved, thereby a display effect of the display panel can be optimized. Embodiments of the present invention can solve the problems in the manufacturing process of the OLED display panel in the prior art that if an angle of vapor deposition of forming an organic light-emitting layer is not well controlled, the organic light-emitting layer may cover an auxiliary electrode, and a common electrode may not be connected to the auxiliary electrode, which causes a technical problem of the OLED display panel having abnormal display.

The OLED display panel and the manufacturing method provided by embodiments of the present invention are described in detail above. Understandably, the description of embodiments above is only for helping to understand the present invention and its core idea, and should not be the limitation of the present invention.

What is claimed is:

1. An organic light-emitting diode (OLED) display panel, comprising:
   a substrate;
   a thin-film transistor disposed on the substrate;
   an insulating layer disposed on the thin-film transistor;
   an auxiliary electrode disposed on the insulating layer;
   a pixel electrode disposed on the insulating layer and electrically connected to the thin-film transistor;
   an organic light-emitting layer disposed on the pixel electrode;
   a shielding stage disposed on the insulating layer, and a projection of the shielding stage on the substrate partially overlapping a projection of the auxiliary electrode on the substrate; and
   a common electrode disposed on the organic light-emitting layer and electrically connected to the auxiliary electrode, wherein the common electrode surrounds at least two lateral sides of the auxiliary electrode;
   wherein the shielding stage comprises at least one inorganic material layer, and an angle between the shielding stage and the substrate is a threshold value.

2. The OLED display panel as claimed in claim 1, wherein a cross-sectional shape of the shielding stage is an inverted trapezoid.

3. The OLED display panel as claimed in claim 1, wherein an area of an overlapping portion of the projection of the shielding stage on the substrate and the projection of the auxiliary electrode on the substrate accounts for over 50% of a total area of the projection of the auxiliary electrode on the substrate.

4. The OLED display panel as claimed in claim 1, wherein the threshold value ranges from 30 to 45 degrees.

5. The OLED display panel as claimed in claim 1, wherein the shielding stage comprises at least one metal layer and at least one organic material layer disposed on the at least one metal layer.

6. The OLED display panel as claimed in claim 1, wherein the shielding stage comprises at least two metal layers and at least two oxide layers.

7. The OLED display panel as claimed in claim 6, wherein the at least two metal layers are laminated, and the at least two oxide layers are laminated.

8. The OLED display panel as claimed in claim 1, wherein the OLED display panel further comprises a pixel electrode layer, and the pixel electrode layer is patterned to form the pixel electrode and a shielding substrate of the shielding stage.

9. A manufacturing method of the OLED display panel as claimed in claim 1, comprising the steps of:
   providing a substrate and forming a circuit functional layer on the substrate;
   forming an auxiliary electrode on the circuit functional layer;
   forming a shielding stage on the circuit functional layer, wherein a projection of the shielding stage on the substrate partially overlaps a projection of the auxiliary electrode on the substrate, the shielding stage comprises at least one inorganic material layer, and an angle between the shielding stage and the substrate is a threshold value; and
   forming a common electrode on the circuit functional layer and controlling an evaporation angle to electrically connect the common electrode and the auxiliary electrode.

10. The manufacturing method of the OLED display panel as claimed in claim 9, wherein a cross-sectional shape of the shielding stage is an inverted trapezoid.

11. The manufacturing method of the OLED display panel as claimed in claim 9, wherein an area of an overlapping portion of the projection of the shielding stage on the substrate and the projection of the auxiliary electrode on the substrate accounts for over 50% of a total area of the projection of the auxiliary electrode on the substrate.

12. The manufacturing method of the OLED display panel as claimed in claim 9, wherein the threshold value ranges from 30 to 45 degrees.

13. The manufacturing method of the OLED display panel as claimed in claim 9, wherein the shielding stage comprises at least one metal layer and at least one organic material layer disposed on the at least one metal layer.

14. The manufacturing method of the OLED display panel as claimed in claim 9, wherein the shielding stage comprises at least two metal layers and at least two oxide layers.

* * * * *